US011617277B2

(12) United States Patent
Huang et al.

(10) Patent No.: US 11,617,277 B2
(45) Date of Patent: Mar. 28, 2023

(54) HINGE MECHANISM

(71) Applicant: SYNCMOLD ENTERPRISE CORP., New Taipei (TW)

(72) Inventors: Chun-Hao Huang, New Taipei (TW); Chien-Cheng Yeh, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 0 days.

(21) Appl. No.: 17/522,364

(22) Filed: Nov. 9, 2021

(65) Prior Publication Data

US 2022/0167514 A1     May 26, 2022

Related U.S. Application Data

(60) Provisional application No. 63/117,146, filed on Nov. 23, 2020.

(30) Foreign Application Priority Data

Aug. 18, 2021 (TW) ................................. 110209779

(51) Int. Cl.
| | |
|---|---|
| *G06F 1/16* | (2006.01) |
| *H05K 5/02* | (2006.01) |
| *F16C 11/04* | (2006.01) |
| *E05D 11/06* | (2006.01) |
| *E05D 1/04* | (2006.01) |

(52) U.S. Cl.
CPC ............ *H05K 5/0226* (2013.01); *F16C 11/04* (2013.01); *G06F 1/1681* (2013.01); *E05D 1/04* (2013.01); *E05D 11/06* (2013.01); *E05Y 2900/606* (2013.01)

(58) Field of Classification Search
None
See application file for complete search history.

(56) References Cited

U.S. PATENT DOCUMENTS

| | | | |
|---|---|---|---|
| 11,194,366 B2* | 12/2021 | Cheng | .................. G06F 1/1652 |
| 11,259,428 B2* | 2/2022 | Kang | ................... H05K 5/0226 |
| 11,301,006 B2* | 4/2022 | Hsu | ....................... G06F 1/1641 |
| 2019/0166703 A1* | 5/2019 | Kim | ....................... G06F 1/1652 |

FOREIGN PATENT DOCUMENTS

TW     1728801     5/2021

* cited by examiner

*Primary Examiner* — Anthony Q Edwards
*Assistant Examiner* — Rashen E Morrison
(74) *Attorney, Agent, or Firm* — Muncy Geissler Olds & Lowe P.C.

(57) ABSTRACT

A hinge mechanism being used for a foldable electronic device is provided. The foldable electronic device comprises a first panel body and a second panel body, which are pivotable with respect to each other The hinge mechanism comprises a central plate, a first pivoting element and a second pivoting element. The central plate comprises a first curved section and a second curved section. The first pivoting element is fixed to the first panel body and grips the first curved section. The second pivoting element is fixed to the second panel body and grips the second curved section. When the first pivoting element and the second pivoting element switch between a retracted position and a stretched position, the first panel body and the second panel body change between an unfolded status and a folded status correspondingly.

15 Claims, 11 Drawing Sheets

HINGE MECHANISM

CROSS REFERENCE TO RELATED APPLICATION

This application claims the benefit of U.S. Provisional Application Ser. No. 63/117,146 filed on Nov. 23, 2020, and the benefit of Taiwan Patent Application Serial No. 110209779 filed on Aug. 18, 2021. The entirety of each application is incorporated herein by reference.

BACKGROUND OF THE INVENTION

1. Field of the Invention

The present invention relates to a hinge mechanism and, more particularly, a hinge mechanism used in a foldable electronic device.

2. Description of Related Art

Taiwan Patent No. 1728801 has disclosed a hinge module and a foldable device having the hinge module. The conventional hinge module comprises a curved body, a first rotating member and a second rotating member. The curved body comprises a curved base and a lid covering and connecting to the curved base. The curved base and the lid are limited each other through a first curved groove, a first rail, a second curved groove and a second rail of the curved base, and a first curved protrusion, a first upper rail, a second curved protrusion and a second upper rail of the lid. A first curved block of the first rotating member is swingable and limited within a first curved guiding portion of the curved base, and a second curved block of the second rotating member is swingable and limited within a second curved guiding portion of the curved base. However, the conventional structure is complicated, and the manufacturing costs cannot be effectively reduced.

SUMMARY OF THE INVENTION

An objective of the present invention is to provide a hinge mechanism, which can perform without using substantial shafts, and the rotation of the two panels can be performed relying on the appearance of the elements of the hinge mechanism. Thus, the hinge mechanism can be more miniaturized, and because no shaft is needed, the connection area between the two panels of the foldable electronic device can be released. The consistency of appearance of the foldable electronic device can be enhanced when it is at an unfolded status or a folded status.

To achieve the objective, a hinge mechanism used for a foldable electronic device is disclosed. The foldable electronic device comprises a central shell, a first panel body and a second panel body. The central shell accommodates the hinge mechanism, the first panel body and the second panel body connect to the hinge mechanism and are pivotable with respect to the central shell. The hinge mechanism comprises a central plate, a first pivoting element and a second pivoting element. The central plate is fixed to the central shell, and comprises a first curved section, a second curved section, a flat section, a first hollow slot and a second hollow slot. The first curved section has a first outer surface and a first inner surface opposite to the first outer surface. The second curved section has a second outer surface and a second inner surface opposite to the second outer surface. The flat section is connected to the first curved section and the second curved section therebetween. The first hollow slot is formed at the flat section and the first curved section. The second hollow slot is formed at the flat section and the second curved section.

The first pivoting element is fixed to the first panel body and comprises at least one first arc arm and at least one first protruding block. The at least one first arc arm has a first concave surface slidably contacting with the first outer surface, the at least one first protruding block has a first convex surface slidably contacting with the first inner surface. The at least one first arc arm and the at least one first protruding block collectively grip the first curved section.

The second pivoting element is fixed to the second panel body and comprises at least one second arc arm and at least one second protruding block. The at least one second arc arm has a second concave surface slidably contacting with the second outer surface, the at least one second protruding block has a second convex surface slidably contacting with the second inner surface. The at least one second arc arm and the at least one second protruding block collectively grip the second arc section.

When the first pivoting element and the second pivoting element switch between a retracted position and a stretched position, the first panel body and the second panel body change between an unfolded status and a folded status correspondingly.

The first pivoting element further comprises at least one first sliding groove formed between the at least one first arc arm and the at least one first protruding block. The first curved section slides in the at least one first sliding groove when the first pivoting element switches between the stretched position and the retracted position. The second pivoting element further comprises at least one second sliding groove formed between the at least one second arc arm and the at least one second protruding block. The second curved section slides in the at least one second sliding groove when the second pivoting element switches between the stretched position and the retracted position.

The first hollow slot has a first wide area and a first narrow area which are intercommunicated with each other. The first wide area is formed at the flat section, and the first narrow area is formed at the first curved section. The at least one first arc arm penetrates through the first wide area and extends outward along the first outer surface. The second hollow slot has a second wide area and a second narrow area which are intercommunicated with each other. The second wide area is formed at the flat section, and the second narrow area is formed at the second curved section. The at least one second arc arm penetrates the second wide area and extends outward along the second outer surface.

The first pivoting element further comprises a first connecting plate connecting to the at least one first arc arm and the at least one first protruding block and being fixed to the first panel body. The second pivoting element further comprises a second connecting plate connecting to the at least one second arc arm and the at least one second protruding block and being fixed to the second panel body.

The first curved section further has a first stopping surface, and the second curved section further has a second stopping surface. The first connecting plate abuts against the first stopping surface when the first pivoting element is at the stretched position, and the second connecting plate abuts against the second stopping surface when the second pivoting element is at the stretched position.

The first panel body and the first curved section abut against each other when the first pivoting element is at the retracted position. The second panel body and the second curved section abut against each other when the second pivoting element is at the retracted position.

The first stopping surface angularly connects to the first outer surface and first inner surface and is adjacent to the first narrow area. The second stopping surface angularly connects to the second outer surface and second inner surface and is adjacent to the second narrow area.

The first curved section further comprises at least one first protruding corner adjacent to the first wide area and the first narrow area, and the second curved section further comprises at least one second protruding corner adjacent to the second wide area and the second narrow area. When the first pivoting element and the second pivoting element are at the retracted position, the at least one first protruding block and the at least one first arc arm collectively grip the at least one first protruding corner, and the at least one second protruding block and the at least one second arc arm collectively grip the at least one second protruding corner.

The first connecting plate has at least one first notch allowing the at least one first protruding corner passing through when the first pivoting element switches from the retracted position to the stretched position. The second connecting plate has at least one second notch allowing the at least one second protruding corner passing through when the second pivoting element switches from the retracted position to the stretched position.

The first pivoting element further comprises a first opening communicating with the at least one first sliding groove, and the second pivoting element further comprises a second opening communicating with the at least one second sliding groove.

Both the first connecting plate and the second connecting plate have a locating block, the locating block of the first connecting plate assembles with the first panel body, and the locating block of the second connecting plate assembles with the second panel body.

The first inner surface, the first outer surface, the first concave surface and the first convex surface are with same curvature, so that the first pivoting element is pivotable about a first virtual axis with respect to the central plate. The second inner surface, the second outer surface, the second concave surface and the second convex surface are with same curvature, so that the second pivoting element is pivotable about a second virtual axis with respect to the central plate.

The first virtual axis and the second virtual axis are parallel and nonoverlapping.

The first pivoting element defines a first length, a first height and a first width. The first wide area defines a first wide area length and a first wide area width, and the first narrow area defines a first narrow area length, in which the first height is less than the first wide area width, the first narrow area length is less than the first width, and the first width is less than the first wide area length. The second pivoting element defines a second length, a second height and a second width. The second wide area defines a second wide area length and a second wide area width, and the second narrow area defines a second narrow area length, in which the second height is less than the second wide area width, the second narrow area length is less than the second width, and the second width is less than the second wide area length.

The first curved section and the flat section collectively define a first orthographic projection length, which is less than the first length. The second curved section and the flat section collectively define a second orthographic projection length, which is less than the second length.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
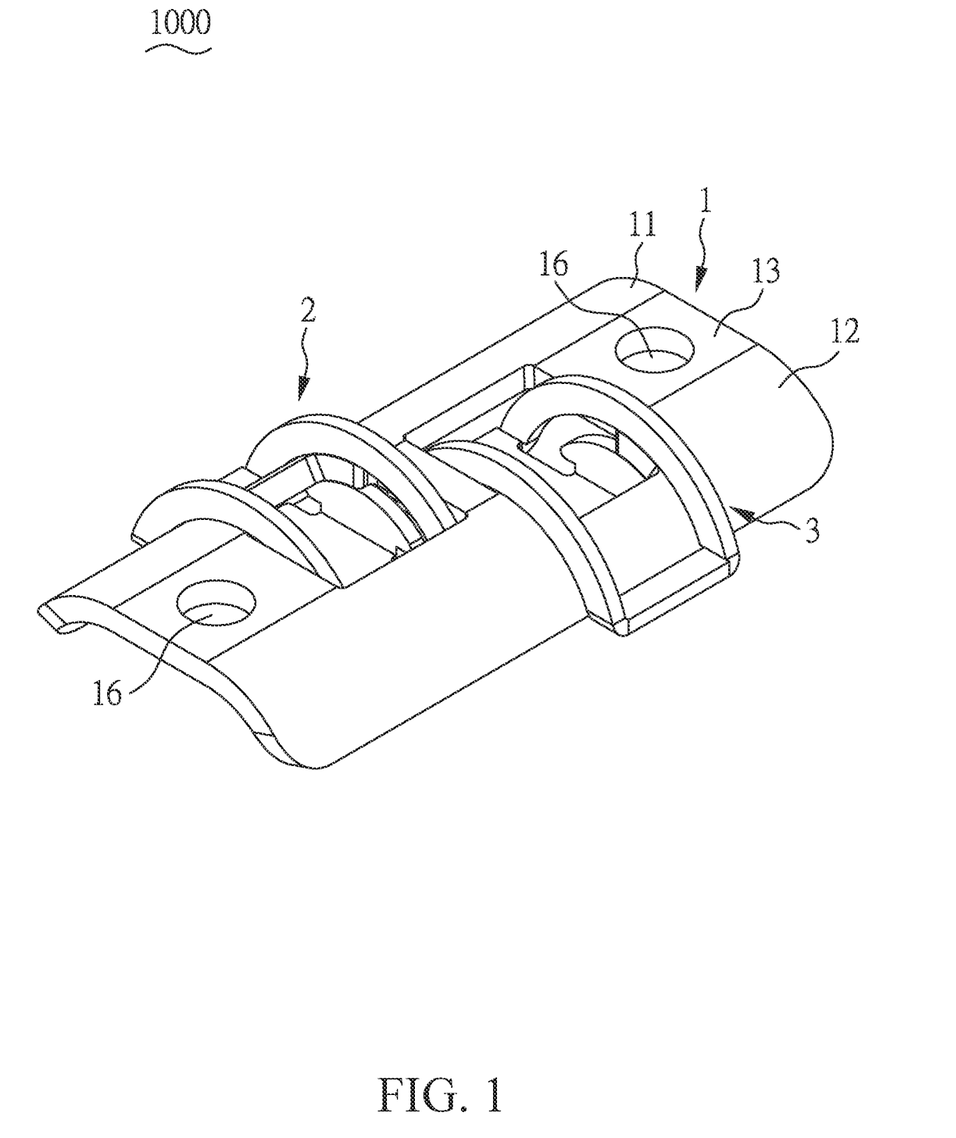
FIG. 1 is a perspective view of the hinge mechanism of the present invention.
Figure 2:
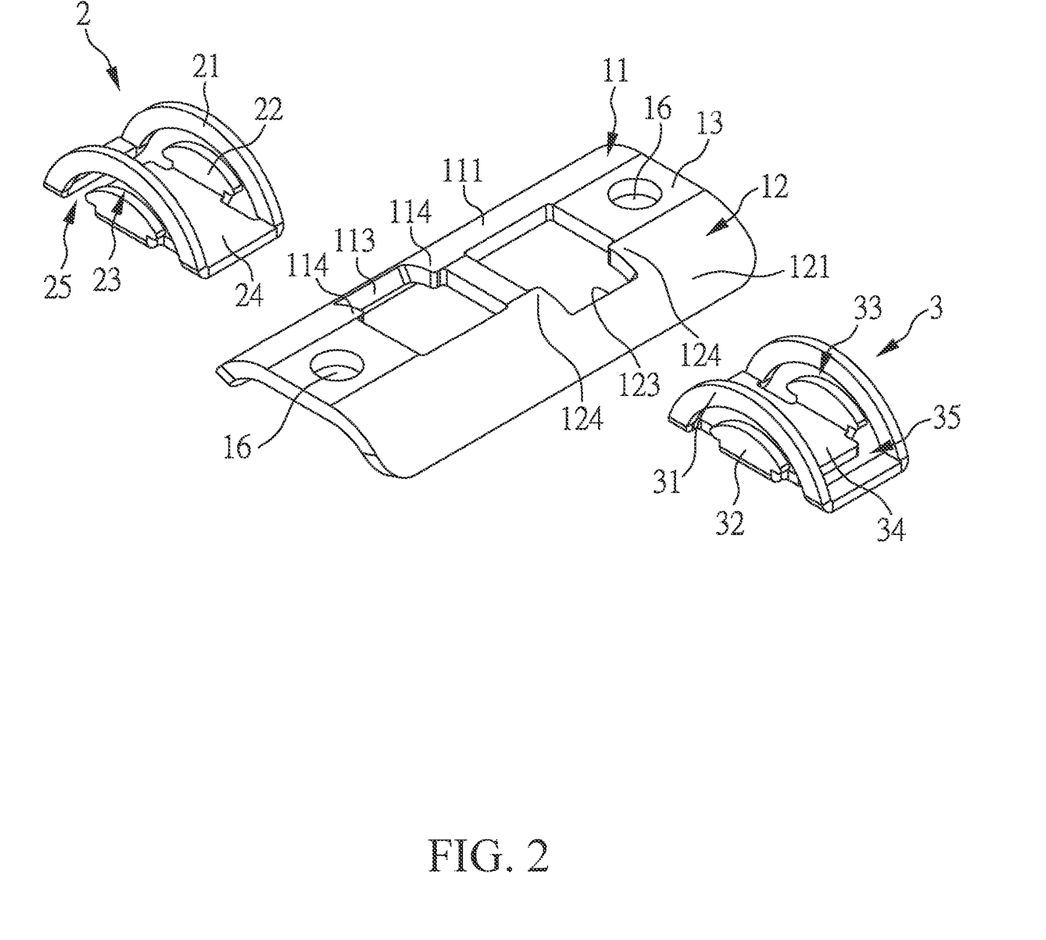
FIG. 2 is an explosive view of the hinge mechanism of the present invention.
Figure 3:
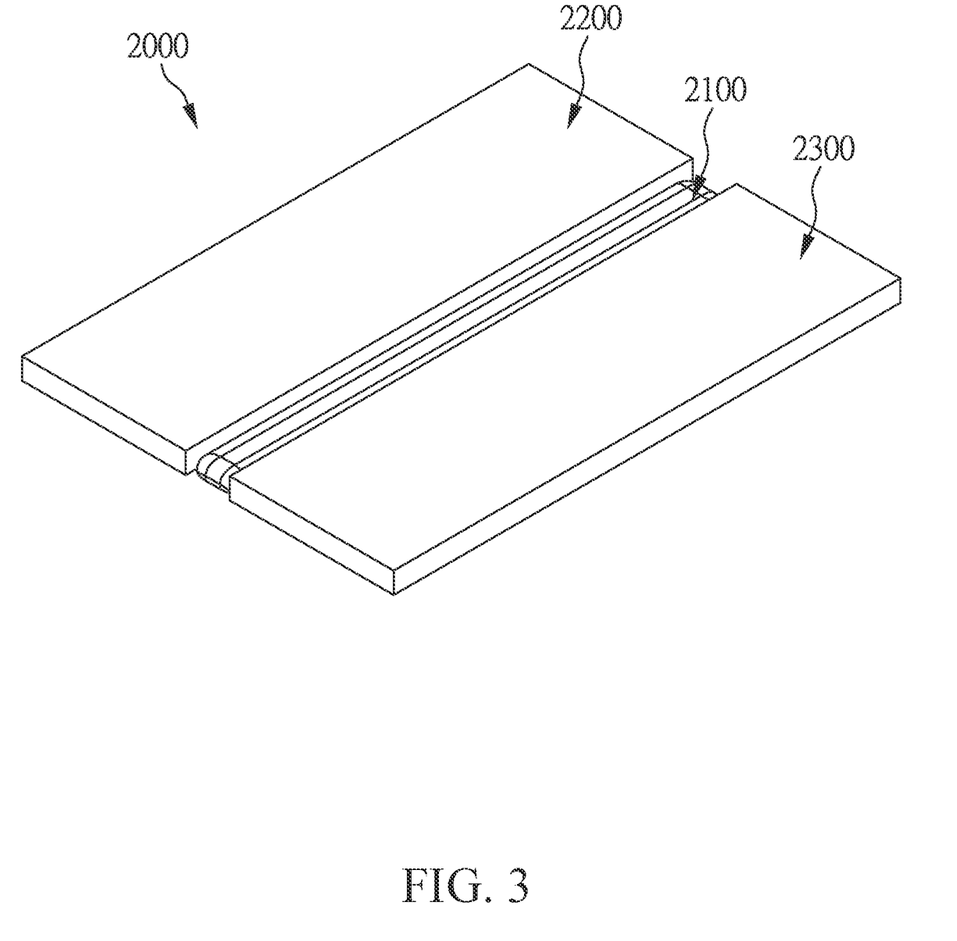
FIG. 3 is a perspective view of the hinge mechanism of the present invention being applied to a foldable electronic device at an unfolded status.
Figure 4:
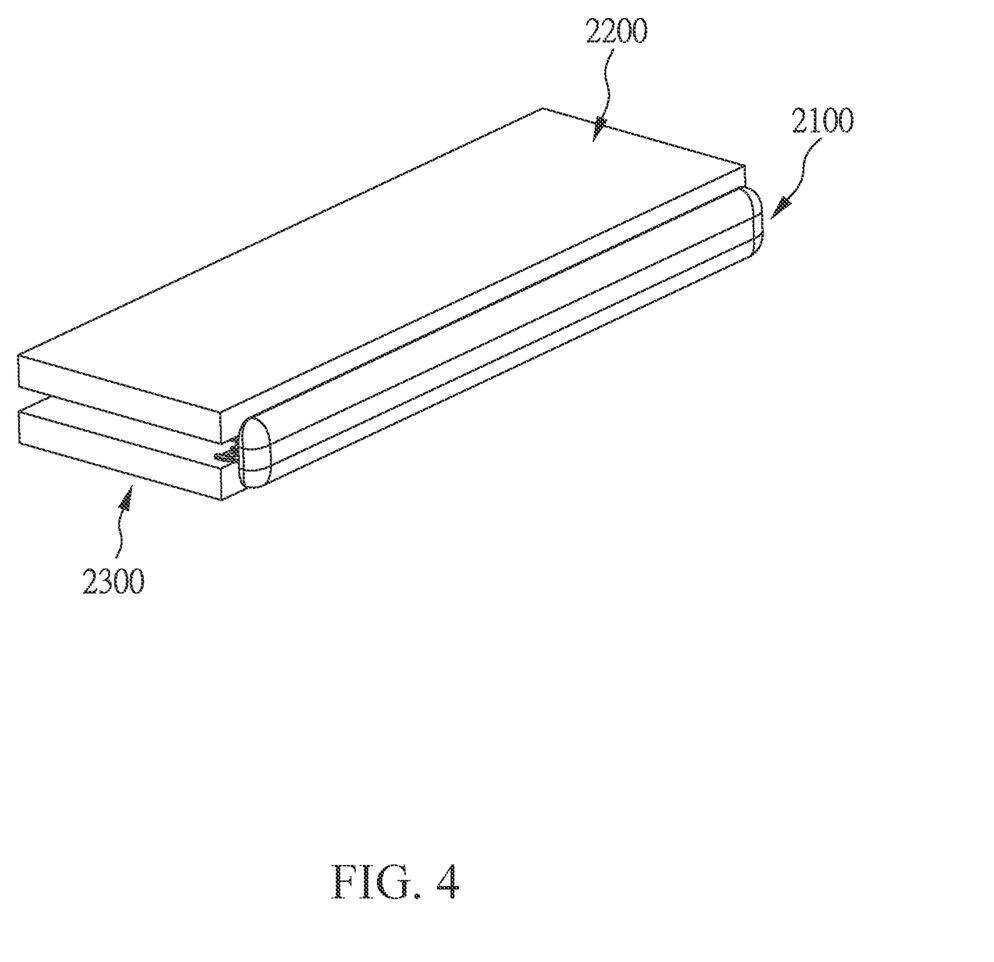
FIG. 4 is a perspective view of the hinge mechanism of the present invention being applied to a foldable electronic device at a folded status.
Figure 5:
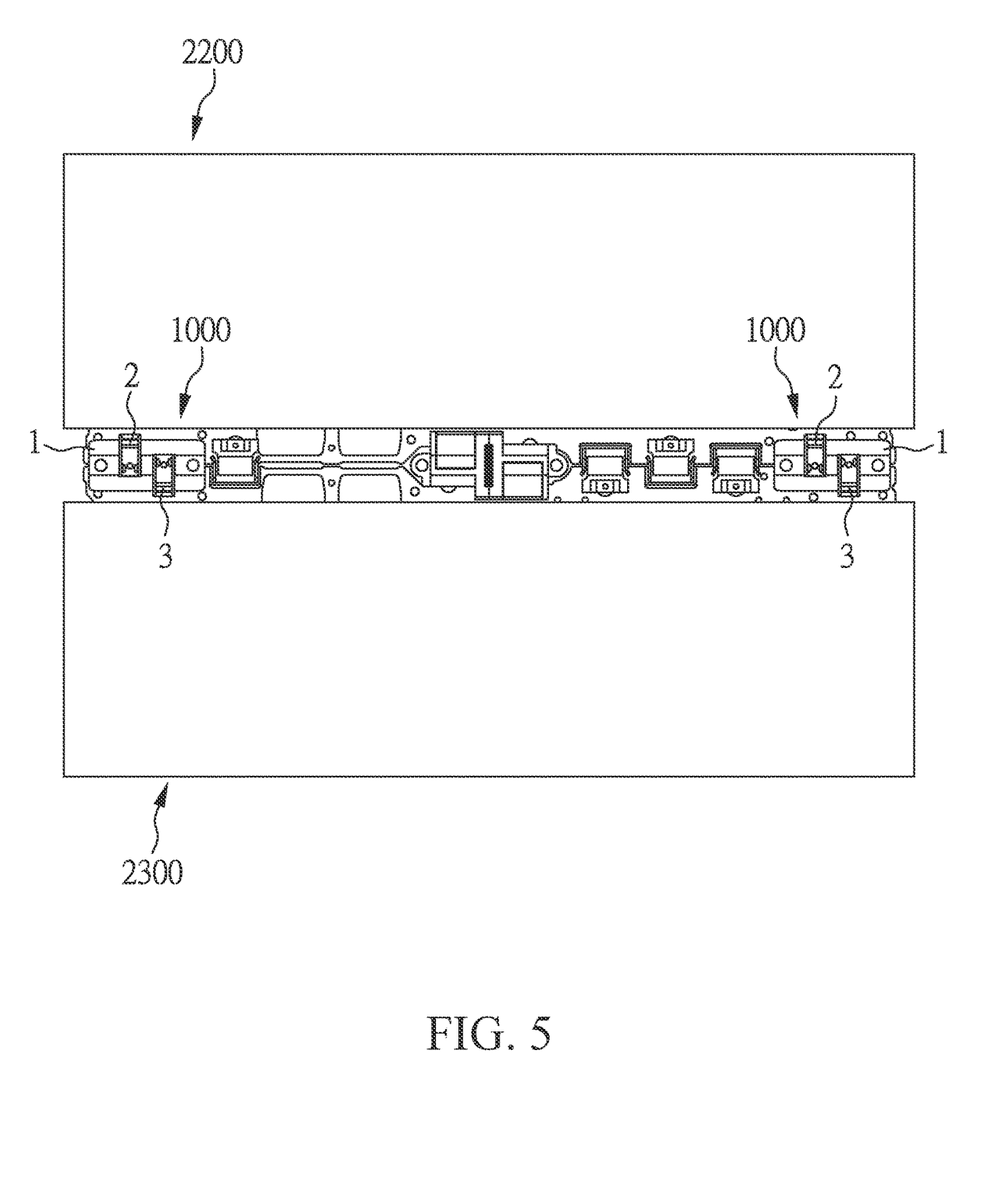
FIG. 5 is a schematic view of the hinge mechanism of the present invention being disposed on a foldable electronic device.

FIG. 1 and FIG. 2 show an embodiment of the hinge mechanism 1000 of the present invention. The hinge mechanism 1000 is used for a foldable electronic device 2000 (for example, a foldable mobile phone). As shown in FIG. 3 to FIG. 5, the foldable electronic device 2000 comprises a central shell 2100, a first panel body 2200 and a second panel body 2300. The central shell 2100 accommodates the hinge mechanism 1000, the first panel body 2200 and the second panel body 2300 connect to the hinge mechanism 1000 and are pivotable with respect to the central shell 2100. As shown in FIG. 5, the number of hinge mechanism 1000 is two, but not limited. The hinge mechanism 1000 comprises a central plate 1, a first pivoting element 2 and a second pivoting element 3. The central plate 1 is fixed to the central shell 2100, the first pivoting element 2 is fixed to the first panel body 2200, and the second pivoting element 3 is fixed to the second panel body 2300.

Figure 6:
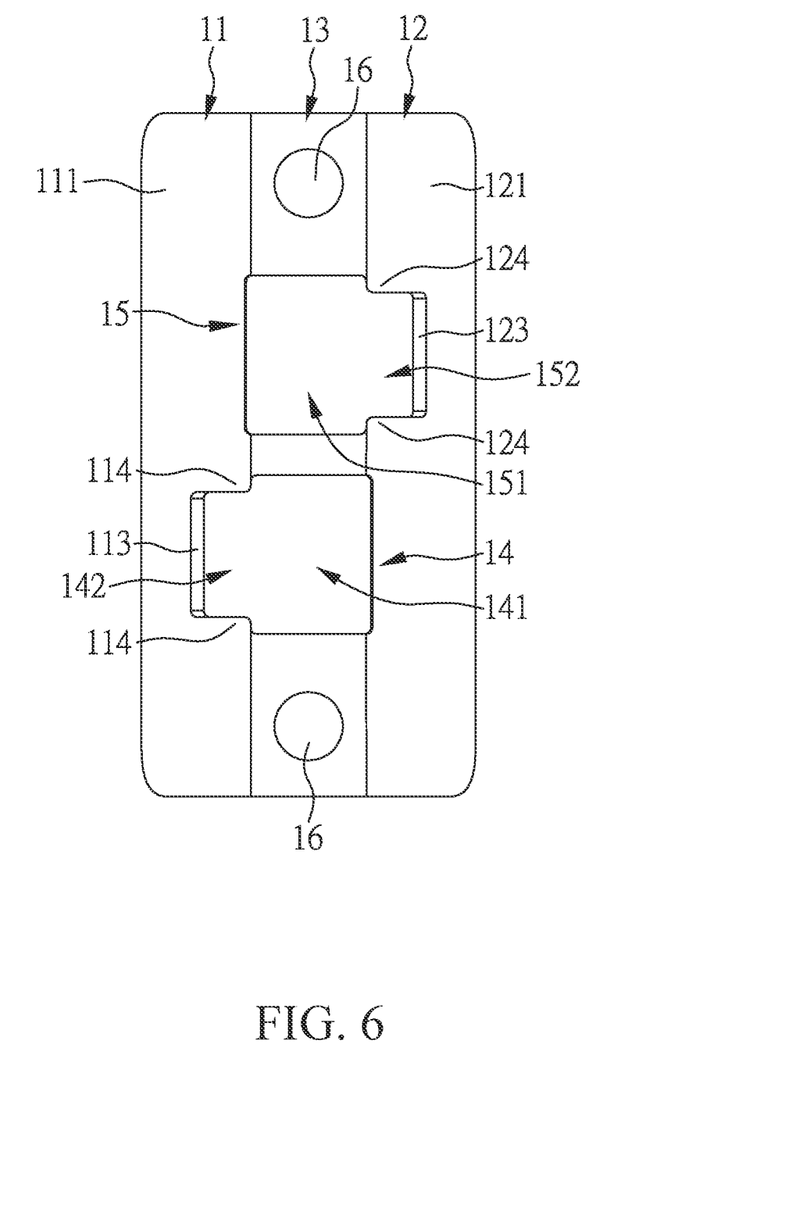
FIG. 6 is a schematic view of the central plate of the hinge mechanism of the present invention.
Figure 7:
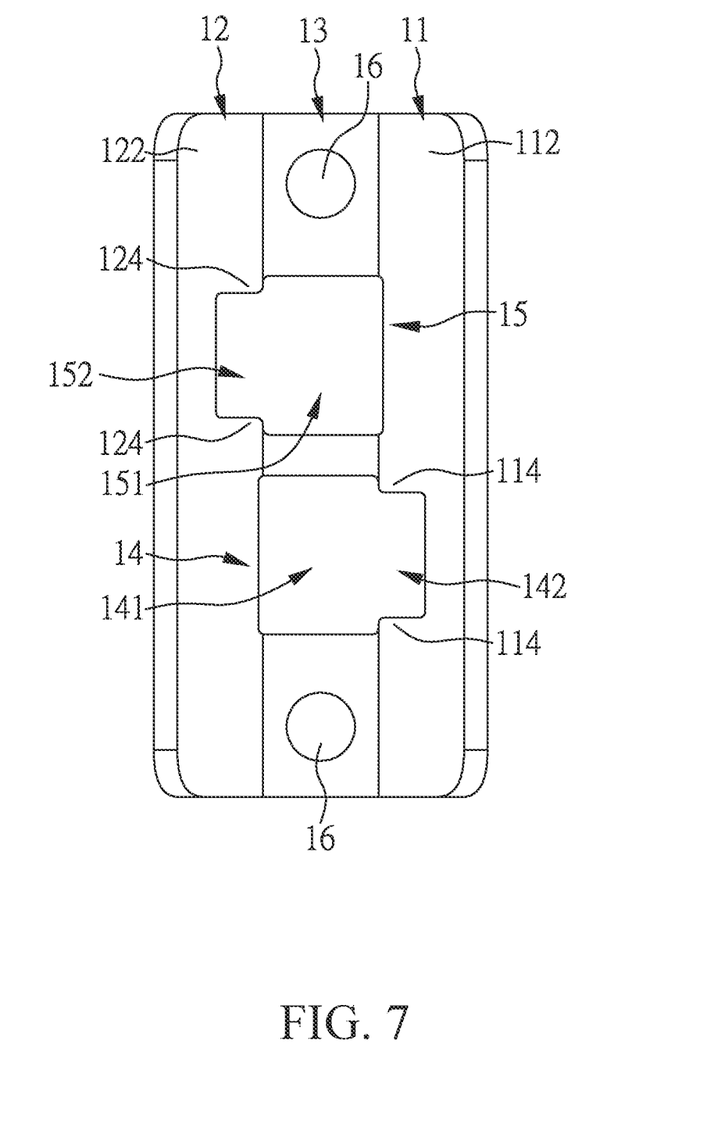
FIG. 7 is another schematic view of the central plate of the hinge mechanism of the present invention.
Figure 8:
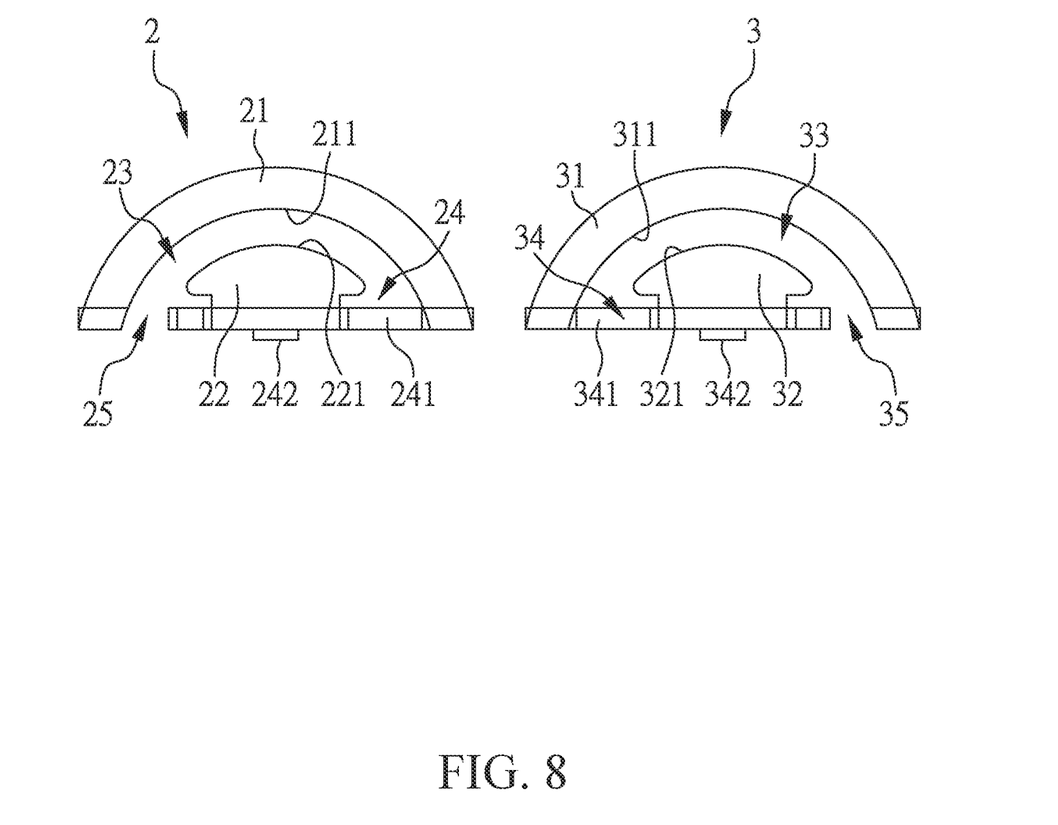
FIG. 8 is a schematic view of the first pivoting element and the second pivoting element of the present invention.

Please further refer to FIG. 6 and FIG. 7, which are views of the inner side and the outer side of the central plate 1. The central plate 1 comprises a first curved section 11, a second curved section 12, a flat section 13, a first hollow slot 14, a second hollow slot 15 and two installing holes 16. The flat section 13 connects to the first curved section 11 and the second curved section 12 therebetween. The first hollow slot 14 is formed at the flat section 13 and the first curved section 11, and the second hollow slot 15 is formed at the flat section 13 and the second curved section 12. The first curved section 11 has a first outer surface 111, a first inner surface 112, a first stopping surface 113 and two first protruding corners 114. The first inner surface 112 is formed opposite to the first outer surface 111. The first stopping surface 113 angularly connects to the first outer surface 111 and the first inner surface 112. The second curved section 12 has a second outer surface 121, a second inner surface 122, a second stopping surface 123 and two second protruding corners 124. The second inner surface 122 is formed opposite to the second outer surface 121. The second stopping surface 123 angularly connects to the second outer surface 121 and the second inner surface 122.

The first hollow slot 14 has a first wide area 141 and a first narrow area 142 which are intercommunicated with each other. The first wide area 141 is formed at the flat section 13, the first narrow area 142 is formed at the first curved section 11, and both of them are, but are not limited to, roughly in rectangular shapes. The first stopping surface 113 is adjacent to the first narrow area 142, and each of the first protruding corners 114 is adjacent to the first wide area 141 and the first narrow area 142. The second hollow slot 15 has a second wide area 151 and a second narrow area 152 which are intercommunicated with each other. The second wide area 151 is formed at the flat section 13, the second narrow area 152 is formed at the second curved section 12, and both of them are, but are not limited to, roughly in rectangular shapes as well. The second stopping surface 123 is adjacent to the second narrow area 152, and each of the second protruding corners 124 is adjacent to the second wide area 151 and the second narrow area 152. Besides, the installing holes 16 are formed at the flat section 13 for installing with screws or latches so that the central plate 1 is able to be fixed to the central shell 2100.

With reference to FIG. 2 and FIG. 8 to FIG. 10, the first pivoting element 2 comprises two first arc arms 21, two first protruding blocks 22, two first sliding grooves 23, a first connecting plate 24 and a first opening 25. The ends of the first arc arms 21 are spaced apart from each other and separately disposed at two sides of the first connecting plate 24. The first arc arms 21 curvedly extend from a head end towards a rear end of the first connecting plate 24. The other ends of the first arc arms 21 do not connect to the rear end of the first connecting plate 24 so that the first opening 25 is formed. The first protruding blocks 22 are spaced apart from each other and separately disposed at the centers of the two sides of the first connecting plate 24 corresponding to the first arc arms 21. The first arc arms 21 and the first protruding blocks 22 define the first sliding grooves 23 collectively, and the first opening 25 communicates with the first sliding grooves 23. As the two first arc arms 21, the two first protruding blocks 22 and the two first sliding grooves 23 forming two symmetrical structures, one of which is taken as an example in the following paragraphs. The first opening 25 and the first sliding grooves 23, which are communicated with each other, allow the first curved section 11 passing through. Hence, the first arc arms 21 can penetrate through the first wide area 141 and extend outward along the first outer surface 111. Each of the first arc arms 21 has a first concave surface 211, which slidably contacts with the first outer surface 111. Each of the first protruding blocks 22 has a first convex surface 221, which slidably contacts with the first inner surface 112. The first arc arms 21 and the first protruding blocks 22 collectively grip the first curved section 11. The first inner surface 112, the first outer surface 111, the first concave surface 211 and the first convex surface 221 are with same curvature so that the first pivoting element 2 can pivot about a first virtual axis X1 with respect to the central plate 1. The first sliding grooves 23 are arranged for the first curved section 11 sliding therein, and thus the first pivoting element 2 is able to assemble with the central plate 1. The first connecting plate 24 has two first notches 241 and a locating block 242. The first notches 241 are formed correspondingly to the first protruding corners 114 respectively and allow the first protruding corners 114 passing through. The locating block 242 is assembled with a hole (not shown in figures) formed on an extending board 2201 of the first panel body 2200. The numbers of the first arc arm 21, the first protruding block 22, and the first notch 241 are not limited, as long as being correspondingly disposed with each other.

Similarly, the second pivoting element 3 comprises two second arc arms 31, two second protruding blocks 32, two second sliding grooves 33, a second connecting plate 24 and a second opening 25. The ends of the second arc arms 31 are spaced apart from each other and separately disposed at two sides of the second connecting plate 34. The second arc arms 31 curvedly extend from a head end towards a rear end of the second connecting plate 34. The other ends of the second arc arms 31 do not connect to the rear end of the second connecting plate 34 so that the second opening 35 is formed. The second protruding blocks 32 are spaced apart from each other and separately disposed at the centers of the two sides of the second connecting plate 34 corresponding to the second arc arms 31. The second arc arms 31 and the second protruding blocks 32 define the second sliding grooves 33 collectively, and the second opening 35 communicates with the second sliding grooves 33. As the two second arc arms 31, the two second protruding blocks 22 and the two second sliding grooves 33 forming two symmetrical structures, one of which is taken as an example in the following paragraphs. The second opening 35 and the second sliding grooves 33, which are communicated with each other, allow the second curved section 12 passing through. Hence, the second arc arms 31 can penetrate through the second wide area 151 and extend outward along the second outer surface 121. Each of the second arc arms 31 has a second concave surface 311, which slidably contacts with the second outer surface 121. Each of the second protruding block 32 has a second convex surface 321, which slidably contacts with the second inner surface 122. The second arc arms 31 and the second protruding blocks 32 collectively grip the second curved section 12. The second inner surface 122, the second outer surface 121, the second concave surface 311 and the second convex surface 321 are with same curvature so that the second pivoting element 3 can pivot about a second virtual axis X2 with respect to the central plate 1. The second sliding grooves 33 are arranged for the second curved section 12 sliding therein, and thus the second pivoting element 3 is able to assemble with the central plate 1. The second connecting plate 34 has two second notches 341 and a locating block 342. The second notches 341 are formed correspondingly to the second protruding corners 124 respectively and allow the second protruding corners 124 passing through. The locating block 342 is assembled with a hole (not shown in figures) formed on an extending board 2301 of the second panel body 2300. The numbers of the second arc arm 31, the second protruding block 32, and the second notch 341 are not limited, as long as being correspondingly disposed with each other.

Figure 9:
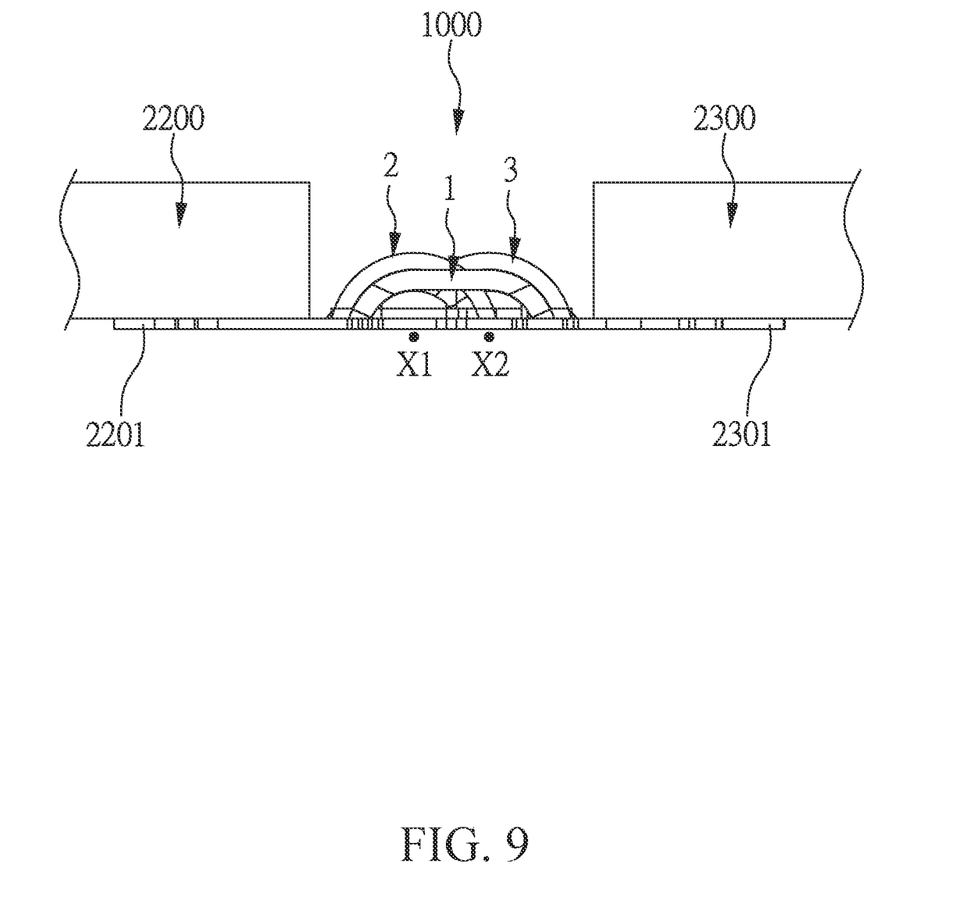
FIG. 9 is a schematic view of the hinge mechanism of the present invention at the retracted position.
Figure 10:
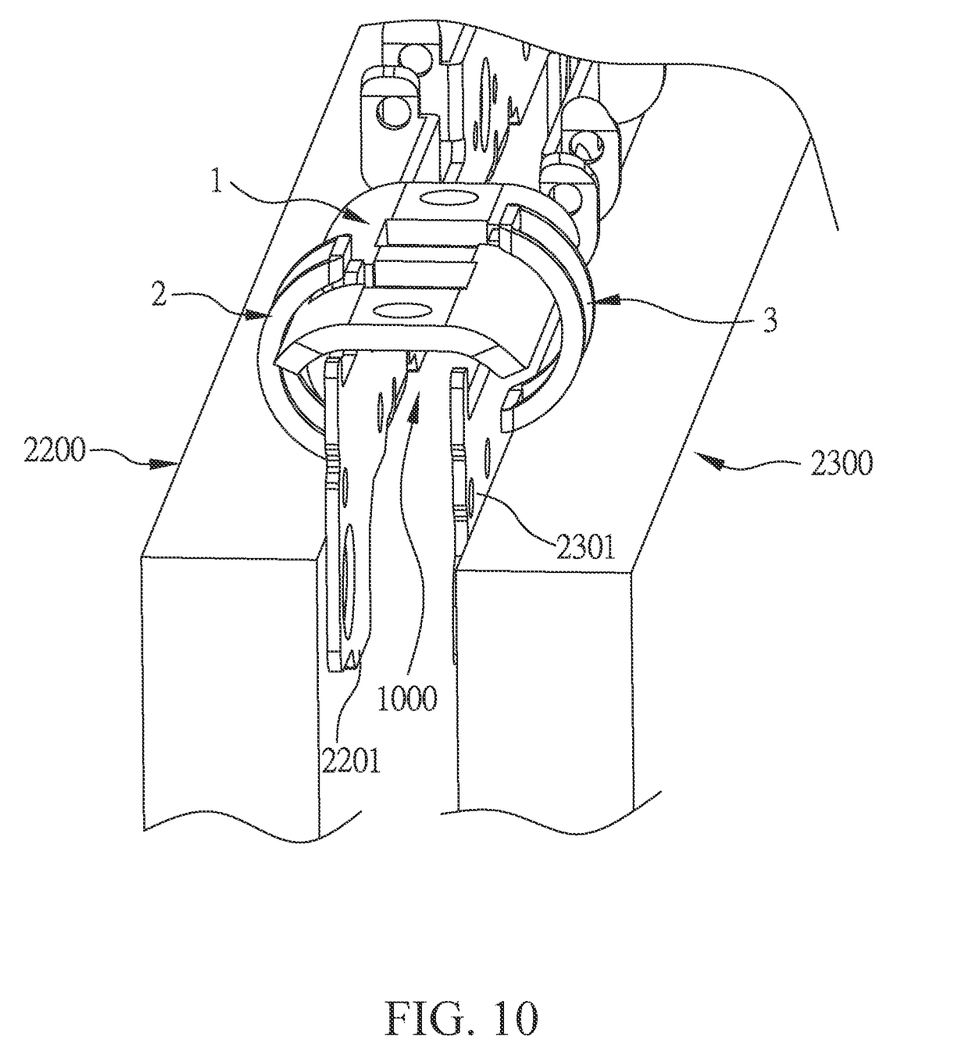
FIG. 10 is a schematic view of the hinge mechanism of the present invention at the stretched position.

The operation of the hinge mechanism 1000 of the invention is illustrated hereinafter. When the first pivoting element 2 and the second pivoting element 3 switch between a retracted position (as shown in FIG. 9) and a stretched position (as shown in FIG. 10), the first panel body 2200 and the second panel body 2300 change between an unfolded status (as shown in FIG. 3) and a folded status (as shown in FIG. 4) correspondingly. That is to say, when the first pivoting element 2 and the second pivoting element 3 are both at the retracted position, the first panel body 2200 and the second panel body 2300 are at the unfolded status; when the first pivoting element 2 and the second pivoting element 3 are both at the stretched position, the first panel body 2200 and the second panel body 2300 are at the folded status.

Please refer to FIG. 9. When the first pivoting element 2 is at the retracted position, the first panel body 2200 and the first curved section 11 abut against with each other, and the first protruding blocks 22 and the first arc arms 21 collectively grip the first protruding corners 114. When the second pivoting element 3 is at the retracted position, the second panel body 2300 and the second curved section 12 abut against with each other, and the second protruding blocks 32 and the second arc arms 31 collectively grip the second protruding corners 124.

When the first pivoting element 2 switches from the retracted position to the stretched position, the first curved section 11 slides in the first sliding grooves 23, and the first protruding corners 114 pass through the first notches 241 respectively. When the second pivoting element 3 switches from the retracted position to the stretched position, the second curved section 12 slides in the second sliding grooves 33, and the second protruding corners 124 pass through the second notches 341 respectively.

Please refer to FIG. 10. When the first pivoting element 2 is at the stretched position, the first connecting plate 24 abuts against the first stopping surface 113. When the second pivoting element 3 is at the stretched position, the second connecting plate 34 abuts against the second stopping surface 123.

When the first pivoting element 2 switches from the stretched position to the retracted position, the first curved section 11 also slides in the first sliding grooves 23. When the second pivoting element 3 switches from the stretched position to the retracted position, the second curved section 12 also slides in the second sliding grooves 33.

The main functions provided by the first protruding corners 114 and the second protruding corners 124 is to enhance the connecting stability between the first pivoting element 2 and the central plate 1, and between the second pivoting element 3 and the central plate 1, by increasing the contact portion of the first curved section 11 which is gripped by the first arc arms 21 and the first protruding blocks 22 therebetween, and increasing the contact portion of the second curved section 12 which is gripped by the second arc arms 31 and the protruding blocks 32 therebetween. The first notches 241 and the second notches 341 are set to increase the rotating ranges of the first pivoting element 2 and the second pivoting element 3 so that the first connecting plate 24 and the second connecting plate 34 will not interfere with the first protruding corners 114 and the second protruding corners 124 when the first pivoting element 2 and the second pivoting element 3 rotate to the stretched position.

Next, the dimensions of the central plate 1, the first pivoting element 2 and the second pivoting element 3 will be further illustrated to show how to meet the requirements of installation. Please refer to FIG. 11, the first pivoting element 2 defines a first length A1, a first height A2 and a first width A3, the first wide area 141 defines a first wide area length B1 and a first wide area width B2, and the first narrow area 142 defines a first narrow area length C1. The second pivoting element 3 defines a second length D1, a second height D2 and a second width D3, the second wide area 151 defines a second wide area length E1 and a second wide area width E2, and the second narrow area 152 defines a second narrow area length F1. The first length A1, the first height A2, the first width A3, the first wide area length B1, the first wide area width B2 and the first narrow area length C1 are the same as the second length D1, the second height D2, the second width D3, the second wide area length E1, the second wide area width E2 and the second narrow area length F1 respectively.

Figure 11:
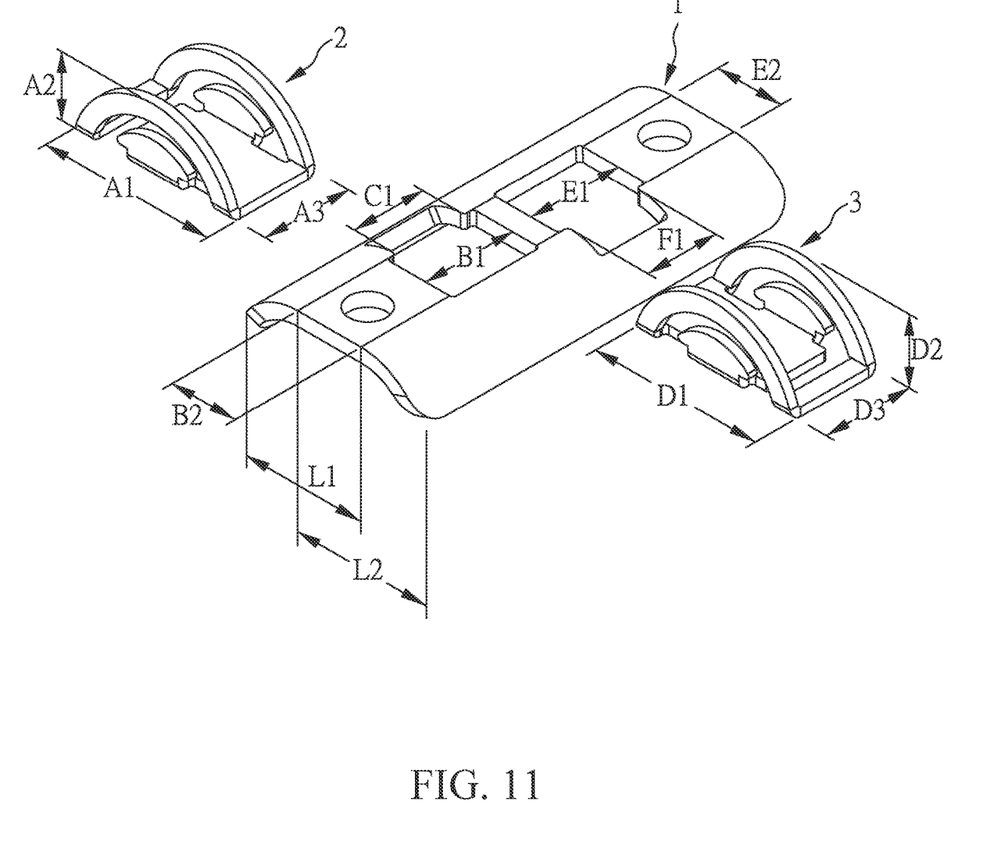
FIG. 11 is a schematic view of the hinge mechanism of the present invention.

Besides, the first curved section 11 and the flat section 13 collectively define a first orthographic projection length L1, which is less than the first length A1. The second curved section 12 and the flat section 13 collectively define a second orthographic projection length L2, which is less than the second length D1.

As to the first pivoting element 2 and the first hollow slot 14, the first height A2 is less than the first wide area width B2, and the first width A3 is less than the first wide area length B1, to enable the first pivoting element 2 to penetrate the first wide area 141 when being assembled to the central plate 1. Further, the first narrow area length C1 is less than the first width A3. Therefore, the first protruding corners 114 of the first curved section 11 are gripped by the first arc arms 21 and the first protruding blocks 22, to increase the contact portions of the first curved section 11 in the first sliding grooves 23. Similarly, as to the second pivoting element 3 and the second hollow slot 15, the second height D2 is less than the second wide area width E2, and the second width D3 is less than the second wide area length E1, to enable the second pivoting element 2 to penetrate the second wide area 151 when being assembled to the central plate 1. Further, the second narrow area length F1 is less than the second width D3. Therefore, the second protruding corners 124 of the second curved section 12 are gripped by the second arc arms 31 and the second protruding blocks 32, to increase the contact portions of the second curved section 12 in the second sliding grooves 33.

In summary, because the first sliding grooves and the second sliding grooves have the same curvature as the first curved section and the second curved section, respectively, the first pivoting element and the second pivoting element can move with respect to the central plate only by the restriction of the appearance. Moreover, the first panel body and the second panel body can rotate with respect to each other and change between the folded status and the unfolded status without disposing of a substantial shaft and a substantial shaft hole. Thus, the hinge mechanism of the invention can be miniaturized, thereby reducing the cost of manufacture.

Although the present invention has been described in considerable detail with reference to certain embodiments thereof, it is to be understood that other possible modifications and variations can be made without departing from the spirit and scope of the invention as hereinafter claimed.

What is claimed is:

1. A hinge mechanism, being used for a foldable electronic device, the foldable electronic device comprising a central shell, a first panel body and a second panel body, the central shell accommodating the hinge mechanism, the first panel body and the second panel body connecting to the hinge mechanism and being pivotable with respect to the central shell, the hinge mechanism comprising:
   a central plate fixed to the central shell, the central plate comprising:
      a first curved section having a first outer surface and a first inner surface opposite to the first outer surface;
      a second curved section having a second outer surface and a second inner surface opposite to the second outer surface;

a flat section connected to the first curved section and the second curved section therebetween;

a first hollow slot formed at the flat section and the first curved section; and a second hollow slot formed at the flat section and the second curved section;

a first pivoting element fixed to the first panel body and comprising at least one first arc arm and at least one first protruding block, the at least one first arc arm having a first concave surface slidably contacting with the first outer surface, the at least one first protruding block having a first convex surface slidably contacting with the first inner surface, wherein the at least one first arc arm and the at least one first protruding block collectively grip the first curved section; and a second pivoting element fixed to the second panel body and comprising at least one second arc arm and at least one second protruding block, the at least one second arc arm having a second concave surface slidably contacting with the second outer surface, the at least one second protruding block having a second convex surface slidably contacting with the second inner surface, wherein the at least one second arc arm and the at least one second protruding block collectively grip the second arc section;

wherein when the first pivoting element and the second pivoting element switch between a retracted position and a stretched position, the first panel body and the second panel body change between an unfolded status and a folded status correspondingly.

2. The hinge mechanism as claimed in claim 1, wherein the first pivoting element further comprises at least one first sliding groove formed between the at least one first arc arm and the at least one first protruding block, and the first curved section slides in the at least one first sliding groove when the first pivoting element switches between the stretched position and the retracted position, and wherein the second pivoting element further comprises at least one second sliding groove formed between the at least one second arc arm and the at least one second protruding block, and the second curved section slides in the at least one second sliding groove when the second pivoting element switches between the stretched position and the retracted position.

3. The hinge mechanism as claimed in claim 2, wherein the first hollow slot has a first wide area and a first narrow area which are intercommunicated with each other, wherein the first wide area is formed at the flat section, the first narrow area is formed at the first curved section, and the at least one first arc arm penetrates through the first wide area and extends outward along the first outer surface, and wherein the second hollow slot has a second wide area and a second narrow area which are intercommunicated with each other, and wherein the second wide area is formed at the flat section, the second narrow area is formed at the second curved section, and the at least one second arc arm penetrates the second wide area and extends outward along the second outer surface.

4. The hinge mechanism as claimed in claim 3, wherein the first pivoting element further comprises a first connecting plate connecting to the at least one first arc arm and the at least one first protruding block and being fixed to the first panel body, and the second pivoting element further comprises a second connecting plate connecting to the at least one second arc arm and the at least one second protruding block and being fixed to the second panel body.

5. The hinge mechanism as claimed in claim 4, wherein the first curved section further has a first stopping surface, and the second curved section further has a second stopping surface, and wherein the first connecting plate abuts against the first stopping surface when the first pivoting element is at the stretched position, and the second connecting plate abuts against the second stopping surface when the second pivoting element is at the stretched position.

6. The hinge mechanism as claimed in claim 5, wherein the first panel body and the first curved section abut against each other when the first pivoting element is at the retracted position, and the second panel body and the second curved section abut against each other when the second pivoting element is at the retracted position.

7. The hinge mechanism as claimed in claim 6, wherein the first stopping surface angularly connects to the first outer surface and first inner surface and is adjacent to the first narrow area, and the second stopping surface angularly connects to the second outer surface and second inner surface and is adjacent to the second narrow area.

8. The hinge mechanism as claimed in claim 7, wherein the first curved section further comprises at least one first protruding corner adjacent to the first wide area and the first narrow area, and the second curved section further comprises at least one second protruding corner adjacent to the second wide area and the second narrow area, and wherein when the first pivoting element and the second pivoting element are at the retracted position, the at least one first protruding block and the at least one first arc arm collectively grip the at least one first protruding corner, and the at least one second protruding block and the at least one second arc arm collectively grip the at least one second protruding corner.

9. The hinge mechanism as claimed in claim 8, wherein the first connecting plate has at least one first notch allowing the at least one first protruding corner passing through when the first pivoting element switches from the retracted position to the stretched position, and the second connecting plate has at least one second notch allowing the at least one second protruding corner passing through when the second pivoting element switches from the retracted position to the stretched position.

10. The hinge mechanism as claimed in claim 9, wherein the first pivoting element further comprises a first opening communicating with the at least one first sliding groove, and the second pivoting element further comprises a second opening communicating with the at least one second sliding groove.

11. The hinge mechanism as claimed in claim 10, wherein both the first connecting plate and the second connecting plate have a locating block, the locating block of the first connecting plate assembles with the first panel body, and the locating block of the second connecting plate assembles with the second panel body.

12. The hinge mechanism as claimed in claim 1, wherein the first inner surface, the first outer surface, the first concave surface and the first convex surface are with same curvature, so that the first pivoting element is pivotable about a first virtual axis with respect to the central plate, and wherein the second inner surface, the second outer surface, the second concave surface and the second convex surface are with same curvature, so that the second pivoting element is pivotable about a second virtual axis with respect to the central plate.

13. The hinge mechanism as claimed in claim 12, wherein the first virtual axis and the second virtual axis are parallel and nonoverlapping.

14. The hinge mechanism as claimed in claim 13, wherein the first pivoting element defines a first length, a first height and a first width, the first wide area defines a first wide area length and a first wide area width, and the first narrow area defines a first narrow area length, in which the first height is less than the first wide area width, the first narrow area length is less than the first width, and the first width is less than the first wide area length, and wherein the second pivoting element defines a second length, a second height and a second width, the second wide area defines a second wide area length and a second wide area width, and the second narrow area defines a second narrow area length, in which the second height is less than the second wide area width, the second narrow area length is less than the second width, and the second width is less than the second wide area length.

15. The hinge mechanism as claimed in claim 14, wherein the first curved section and the flat section collectively define a first orthographic projection length, which is less than the first length, and the second curved section and the flat section collectively define a second orthographic projection length, which is less than the second length.

\* \* \* \* \*